United States Patent [19]

Xu et al.

[11] Patent Number: 4,901,122
[45] Date of Patent: Feb. 13, 1990

[54] DOUBLE-BASE HOT CARRIER TRANSISTOR

[75] Inventors: Jingming Xu, Toronto, Canada; Michael Shur, Golden Valley, Minn.

[73] Assignee: Regents of the University of Minnesota, St. Paul, Minn.

[21] Appl. No.: 327,381

[22] Filed: Mar. 22, 1989

Related U.S. Application Data

[63] Continuation of Ser. No. 86,001, Aug. 14, 1987, abandoned.

[51] Int. Cl.$^4$ .......................................... H01L 29/161
[52] U.S. Cl. ........................................ 357/16; 357/34; 357/4
[58] Field of Search ................................ 357/16, 34, 4

[56] References Cited

U.S. PATENT DOCUMENTS 4,566,020 1/1986 Shannon .................................. 357/67
4,712,121 12/1987 Yokoyama ............................ 357/34

OTHER PUBLICATIONS

IBM Technical Disclosure Bulletin, vol. 29, #7, pp. 2914–2915, Dec. 1986.
Michael S. Shur and Lester F. Eastman, Ballistic Transport In Semiconductor at Low Temperatures for Low-Power High-Speed Logic, *IEEE Transactions on Electron Devices*, vol. ED-26, No. 11, Nov. 1979.
M. Heiblum et al., "Direct Observation of Ballistic Transport in GaAs," *Phys. Rev. Lett.*, 2200, vol. 21, Jul. 1–Dec. 31, 1985.
A. F. J. Levi et al., "Injected-Hot-Electron Transport in GaAs," *Phys. Rev. Lett.*, vol. 55, No. 19; 4 Nov., 1985.
J. Pozela and A. Reklaitis, "Electron Transport Properties in GaAs at High Electric Fields," *Solid-State Electronics*, vol. 23, No. 9-B, 1980.
Herbert Kroemer, "Heterostructure Bipolar Transistors: What Should We Build?" *J. Vac. Sci. Technol.* B1(2), Apr.–Jun. 1983.
B. Jogai et al., "Frequency and Power Limit of Quantum Well Oscillators," *Appl. Phys. Lett.*, 48(15), 14 Apr., 1986.
T. R. Chen et al., "A Stripe-Geometry InGaAsP/InP Heterojunction Bipolar Transistor Suitable for Optical Integration," *IEEE Electron Device Letters*, vol. EDL-8, No. 5, May, 1987.
M. Tomizawa et al., "Modeling for an AlGaAs/GaAs Heterostructure Device Using Monte Carlo Simulation," *IEEE Electron Device Letters*, vol. EDL-6, No. 7, Jul., 1985.
Harold U. Baranger and John W. Wilkins, "Ballistics Electrons in an Inhomogeneous Submicron Structure: Thermal and Contact Effects," *Physical Review B*, vol. 30, No. 12, 15 Dec., 1984.
Johnson Lee, "The Probability for Ballistic Electron Motion in n-GaAs," *IEEE Electron Device Letters*, vol. EDL-2, No. 7, Jul., 1981.
John R. Hayes, "Hot Electron Transistors," *Extended Abstracts of the 18th (1986 International) Conference on Solid State Devices and Materials*, Tokyo, 1986, pp. 331–334.
L. F. Eastman et al., "Ballistic Electron Motion in GaAs at Room Temperature," *Electronics Letters*, vol. 16, No. 13, Jun. 19, 1980.

(List continued on next page.)

*Primary Examiner*—Andrew J. James
*Assistant Examiner*—Mark Prenty
*Attorney, Agent, or Firm*—Kinney & Lange

[57] ABSTRACT

A hot electron transistor includes two base regions between the emitter and collector, with the first and second bases separated by a base-base barrier. The emitter injects high energy electrons across an emitter barrier into the first base, which acts as an electron gun to focus and accelerate the electrons and inject them across the base-base barrier into the second base. An input signal is applied to the second base, to modulate the flow of electrons from the second base across a collector barrier and into the collector.

13 Claims, 6 Drawing Sheets

OTHER PUBLICATIONS

Mordehai Heiblum, "Tunneling Hot Electron Transfer Amplifiers (Theta): Amplifiers Operating Up to the Infrared," *Solid State Electronics*, vol. 24, pp. 343–366, 1981.

J. R. Hayes et al., "Hot-Electron Spectroscopy of GaAs," *Physical Review Letters*, vol. 54, No. 14, Apr. 8, 1985.

S. Muto et al., "Subpicosecond Base Transit Time Observed in a Hot-Electron Transistor (HET)," *Electronics Letters*, vol. 21, No. 13, Jun. 20, 1985.

C. O. Bozler et al., "Fabrication and Microwave Performance of the Permeable Base Transistor," *1979 IEEE*, CH1504-0/79/0000-0384$00.75, 1979.

Michael S. Shur, "Ballistic Transport in a Semiconductor With Collisions" *IEEE Transactions on Electronic Devices*, vol. ED-28, No. 10, Oct., 1981.

M. Heiblum et al., "Tunneling Hot-Electron Transfer Amplifer: A Hot-Electron GaAs Device With Current Gain," *Appl. Phys. Lett.*, vol. 47, No. 10, Nov. 15, 1985.

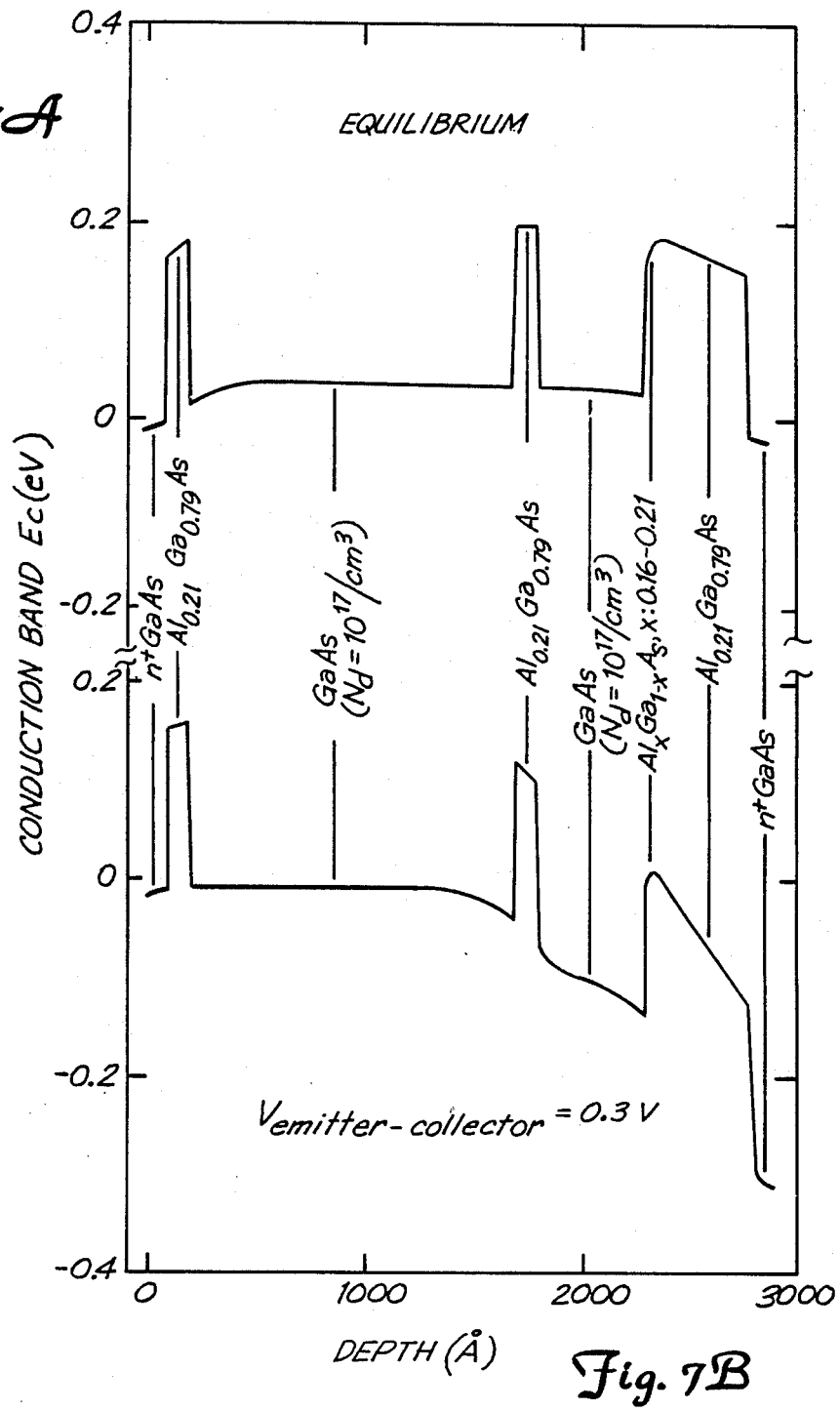

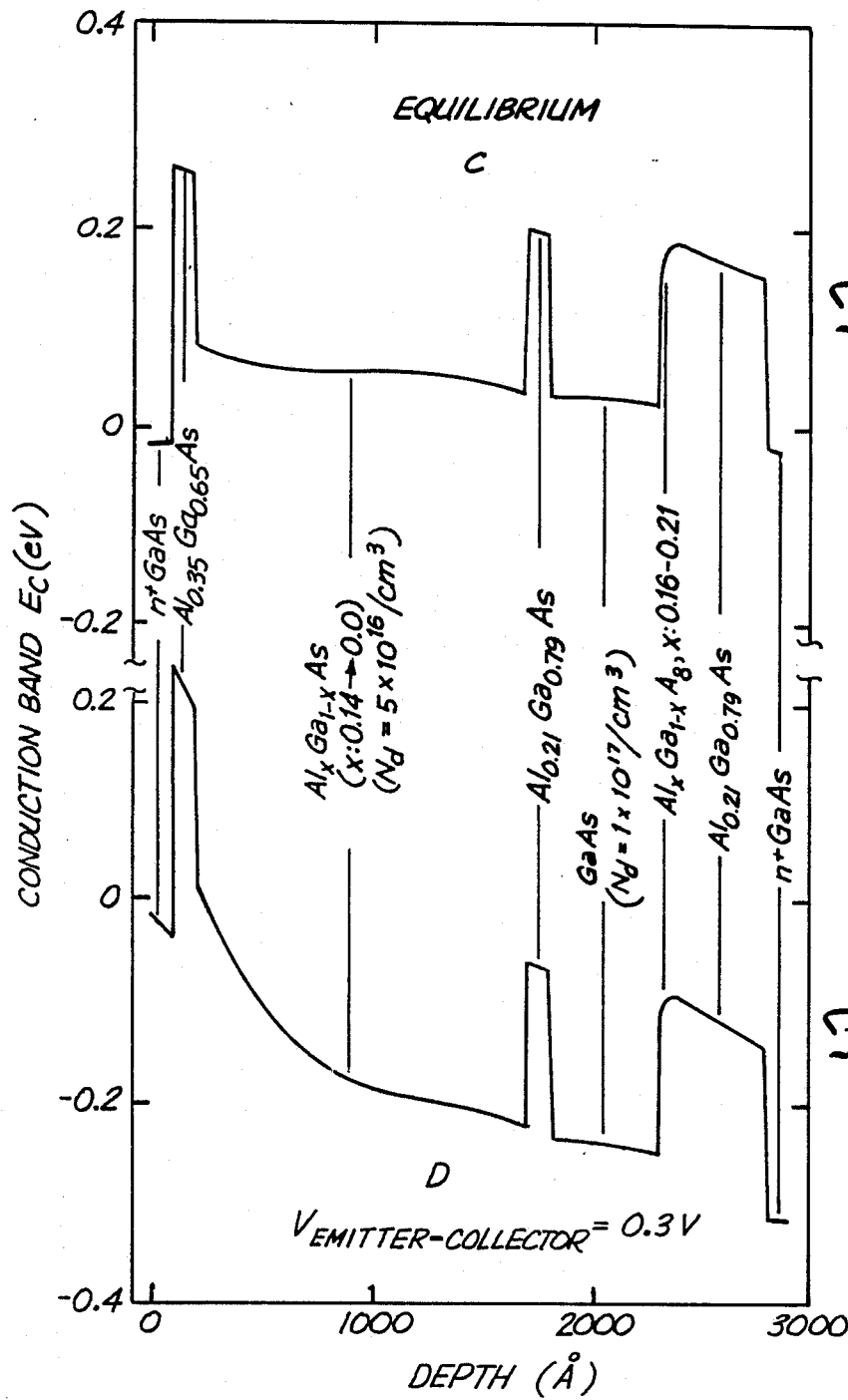

DOUBLE-BASE HOT CARRIER TRANSISTOR

This a continuation of application Ser. No. 07/086,001, filed Aug. 14, 1987 (now abandoned).

BACKGROUND OF THE INVENTION

1. Field of the Invention

The present invention relates to semiconductor devices which take advantage of ballistic transport of energetic carriers.

2. Description of the Prior Art

The switching speed of the transistors that lie at the heart of most electronic circuits is limited by the electron or hole velocity. Usually, the motion of carriers (electrons and holes) in semiconductor devices is constantly interrupted by scattering. Each carrier is scattered frequently and in every direction so that the net flow of electrons in the direction of electric field is much slower than the actual speed of the electrons. If it were possible to enable electrons in semiconductors to move without scattering—i.e. to move ballistically—then the speed of transistors could be increased dramatically.

Ballistic motion of electrons in semiconductors was predicted in M. Shur and L. Eastman, IEEE Trans. Electron. Device ED-26, 1677 (1979). This model states that under certain conditions, the ballistic transport of electrons can be realized in short semiconductor devices (i.e. ballistic devices). Considerable effort has been directed toward the development of such devices, and numerous theoretical and experimental studies have pointed to the existence of the ballistic transport mechanism.

Only recently has a direct confirmation of ballistic motion been obtained by two groups based on the studies of the electron transport in a short base region of a high electron transistor (HET) and a planar doped barrier transistor (PDBT). M. Heiblum, M. I. Nathan, D. C. Thomas and C. M. Knoedler, Phys. Rev. Lett. 55, No. 2,2200 (1985); and A. F. J. Levi, J. R. Hayes, P. M. Platzman and W. Wiegmann, Phys. Rev. Lett. 55, No. 19, 2071 (1985).

The device structures which make use of ballistic transport typically include a ballistic electron injector for launching high energy (hot) electrons; a highly doped base region which is thinner or approximately equal to the mean free path of hot electrons; and a collector with an associated barrier which prevents cold electrons from passing while allowing hot electrons to pass from the base to the collector. The ballistic electron injector can be formed, for example, by a heterojunction, a planar doped barrier, or a tunnel barrier. In each case, a barrier is formed between an emitter and the base so that the electrons reaching the base region have a high potential energy. Since the base is a region of relatively low potential energy, the kinetic energy of the injected electrons increases as their potential energy decreases.

Despite a high level of interest in high speed semiconductor devices, and considerable theoretical and experimental efforts directed to the use of ballistic transport of electrons in semiconductors, development of practical ballistic devices is still at a very early state. Material problems, technology difficulties and lack of good means for effective launching and collecting of ballistic electrons have all limited the performance of proposed and experimentally built devices.

SUMMARY OF THE INVENTION

The present invention is based upon the discovery that the performance of hot electron transistors and other ballistic semiconductor devices can be greatly improved if a focused beam of energetic carriers is injected into the active region of these structures. In the present invention, this is achieved by the use of first and second bases separated by a base-base barrier. The first base receives the energized carriers from the hot carrier injector and focuses and accelerates those carriers. The accelerated and focused carriers are injected from the first base into the second base, which is the active region where the input signal is applied. This input signal controls the flow of the beam of carriers from the second base into the collector. With the present invention, the efficiency of launching and collecting ballistic carriers is substantially increased.

BRIEF DESCRIPTION OF THE DRAWINGS

FIG. 2 shows the energy distribution of electrons at the collector of the hot electron transistor for two different base doping levels.

FIGS. 7A and 7B show band structures of a DBHET with a GaAs first base at equilibrium, and under an applied emitter-collector bias of 0.3 volts, respectively.

FIGS. 8A and 8B show band structures of a DBHET with an AlGaAs first base at equilibrium, and under an applied emitter-collector bias of 0.3 volts, respectively.

FIG. 9 shows transit time across a 500 Angstrom base of an HET for three different built-in fields (as shown by dashed curves), and transit time across a 500 Angstrom second base of a DBHET for three different electric fields in the first base (as shown in solid curves).

FIG. 10 shows the energy distribution of electrons at the collector of an HET (dashed curves) and a DBHET (solid curves) for various electric fields.

DETAILED DESCRIPTION OF THE PREFERRED EMBODIMENTS

In order to appreciate the improvement which is provided by the present invention, it is first necessary to have a thorough understanding of the electron transport in the base of a hot electron transistor or other submicron structure using the ballistic mode of carrier transport. FIGS. 1-4 show the results of a Monte Carlo simulation of electron transport in the base of a prior art hot electron transistor (HET).

Figure 1:
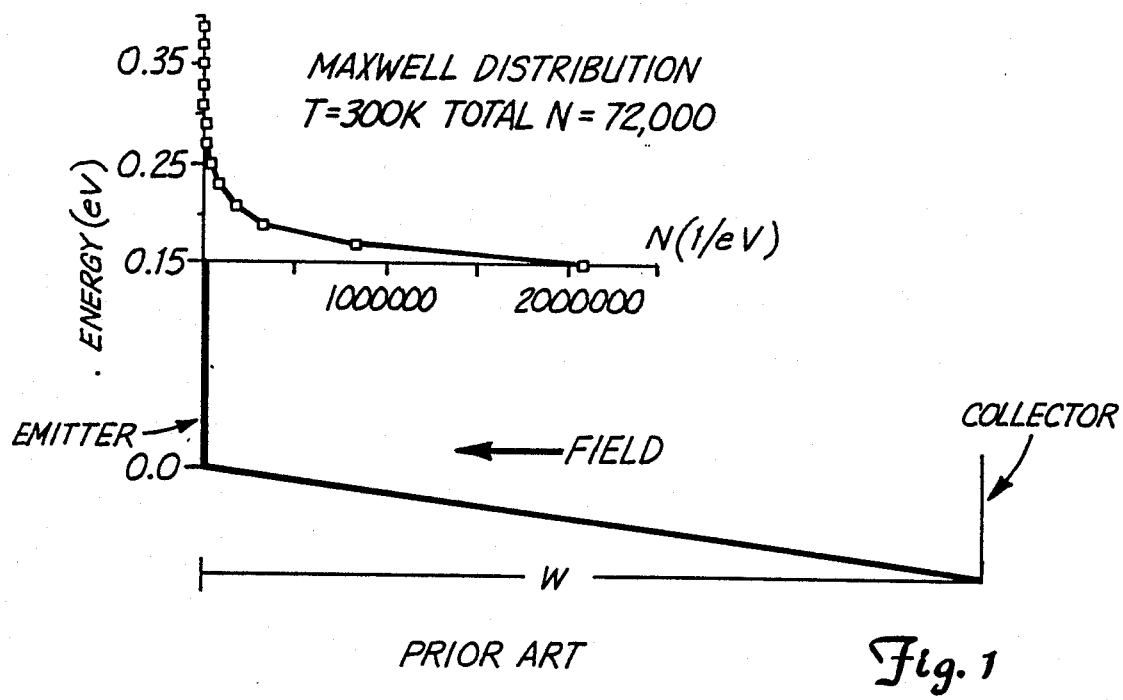
FIG. 1 graphically illustrates an idealized hot electron transistor model, and shows electron distribution as a function of energy at the emitter of the hot electron transistor.

The model used for this simulation and analysis is illustrated in FIG. 1. This is a simplified version of the HET band structure which is shown in M. Heiblum, M. I. Nathan, D. C. Thomas and C. M. Knoedler, Phys. Rev. Lett. 55, No. 2, 2200 (1985).

For the purpose of this analysis, the emitter barrier is considered to be an ideal "electron launcher" injecting electrons into the base. Electrons may come into the base only with energies higher than the emitter barrier owing to the thermionic emission over the emitter barrier. In other words, the emitter barrier is not transparent to quantum tunneling. This analysis, therefore, is more generalized than found in some experimentally studied devices, where tunneling through the emitter barrier is an important part of the injection of electrons into the base, and may lead to a more narrow angular distribution of injected electrons than is found in this generalized analysis.

The electron distribution as a function of energy at the emitter was assumed to be Maxwellian as shown by the solid line with squares in FIG. 1. Using this model, the motion of a large number of electrons with positive values of the velocity component along the direction towards the collector was then simulated. The angle between the velocity of an injected electron and the direction perpendicular to the emitter-base interface was chosen randomly in order to reproduce the angular dependence corresponding to the Maxwell distribution of the injected electrons. Electrons travelling through the base could experience polar optical phonon scattering, acoustic scattering, impurity scattering and intervalley scattering between equivalent and nonequivalent valleys before reaching the collector. A small fraction (10–25%, mainly depending on the base properties) of the electrons were reflected back into the emitter as the result of scattering events. If the energy of the reflected electrons was higher than the emitter barrier, they were assumed to be absorbed by the emitter. If the energy of the reflected electron was smaller than the emitter barrier, they were assumed to contribute to the base current. For simplicity we neglected the quantum reflection on both the emitter side and the collector side of the device. The scattering processes of individual electrons were simulated by the standard Monte Carlo method taking into account the nonparabolicity. Scattering parameters used in this simulation are the same as used in Pozela and A. Reklaitis, *Solid State Electron*, Vol. 23, 927 (1980).

We also introduced an electric field accelerating electrons in the base. This electric field simulated a possible enhancement of the ballistic motion by the built-in electric field in the base which may be created either by nonuniform doping of the base or by grading the base composition (as proposed in H. Kroemer, J. Vac. Sci. Technol. B, 1(2), 126 (1983) and/or by an external bias.

In order to reproduce the energy distribution function of the electrons reaching the collector we simulated the transport of approximately 72,000 electrons until every one of them reached the collector region, contributed to the base current or was scattered back into the emitter. (As a practical matter we allowed not more than 5000 scattering events to occur for each electron. Nevertheless, we found that for such a large number of scattering events all of the electrons either reached the collector, contributed to the base current or were reflected back into the emitter when the electric field was larger than or equal to 2 kV/cm.)

Figure 2:
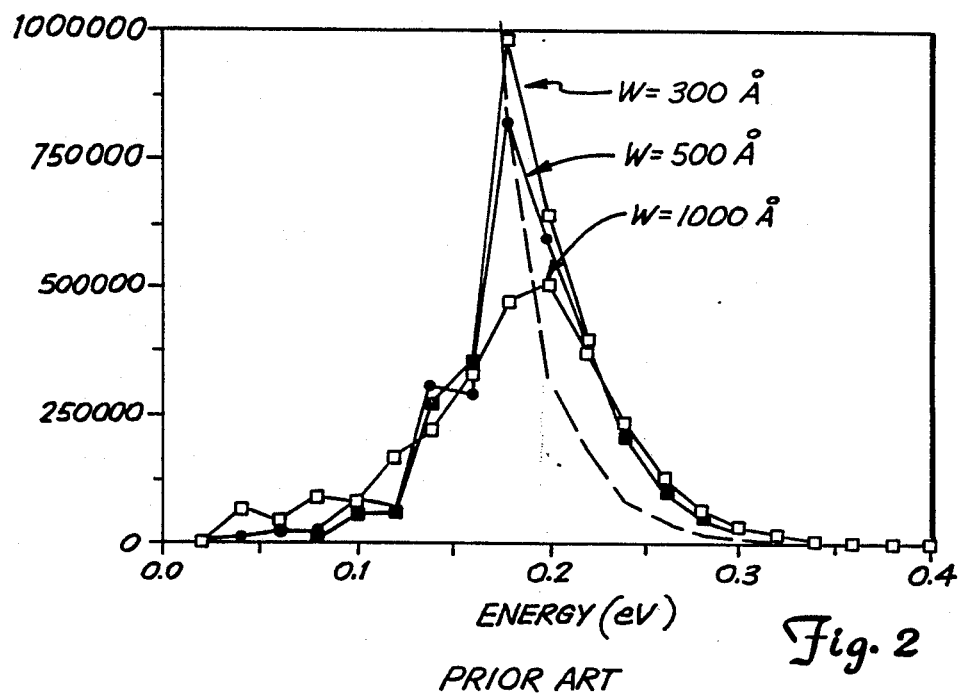
FIG. 2 shows energy distributions of electrons reaching the collector of the hot electron transistor of FIG. 1 for base thicknesses W of 300 Angstroms, 500 Angstroms, and 1,000 Angstroms.

The energy distributions of electrons reaching the collector for the base thickness, W, of 300, 500 and 1000 angstroms at 300K are shown in FIG. 2 where we also show the energy distribution (dashed line) of the electrons injected at the emitter-base junction. In this calculation, we chose a base doping level of $10^{17}/cm^3$. FIG. 2 shows that the number of electrons reaching the collector for the effective collector barrier height close to 0.2 eV (this should take into account the applied collector voltage) decreased with the increase in the base length, as expected. This manifested itself as a decrease in the peak of the distribution. However, at the high energy tail there was actually a net increase in the number of electrons arriving at the collector compared to the distribution of the electrons at the emitter. This was caused by the heating of the electrons by the electric field in the base.

Figure 3:
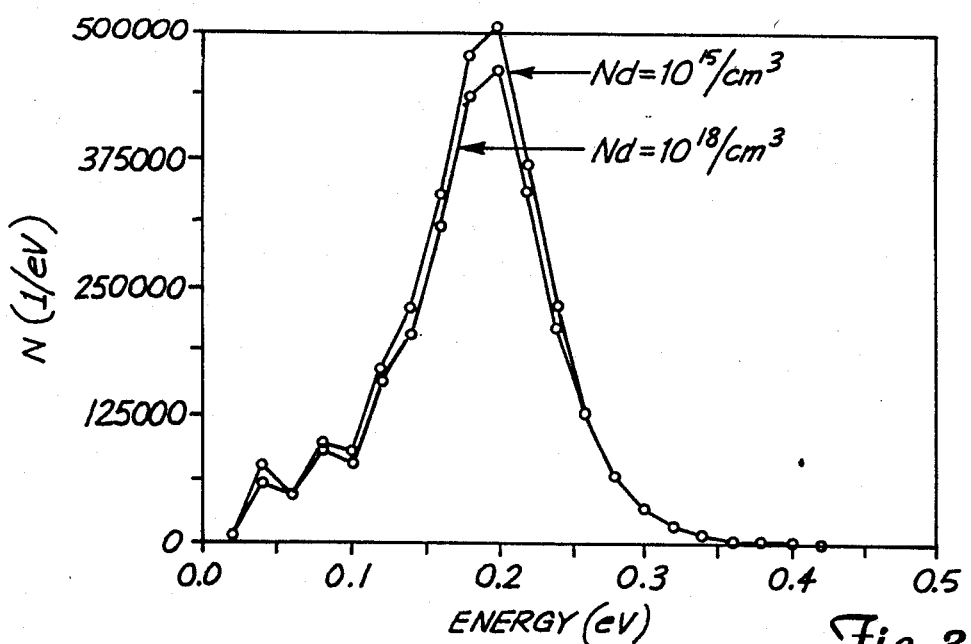
Figure 4:
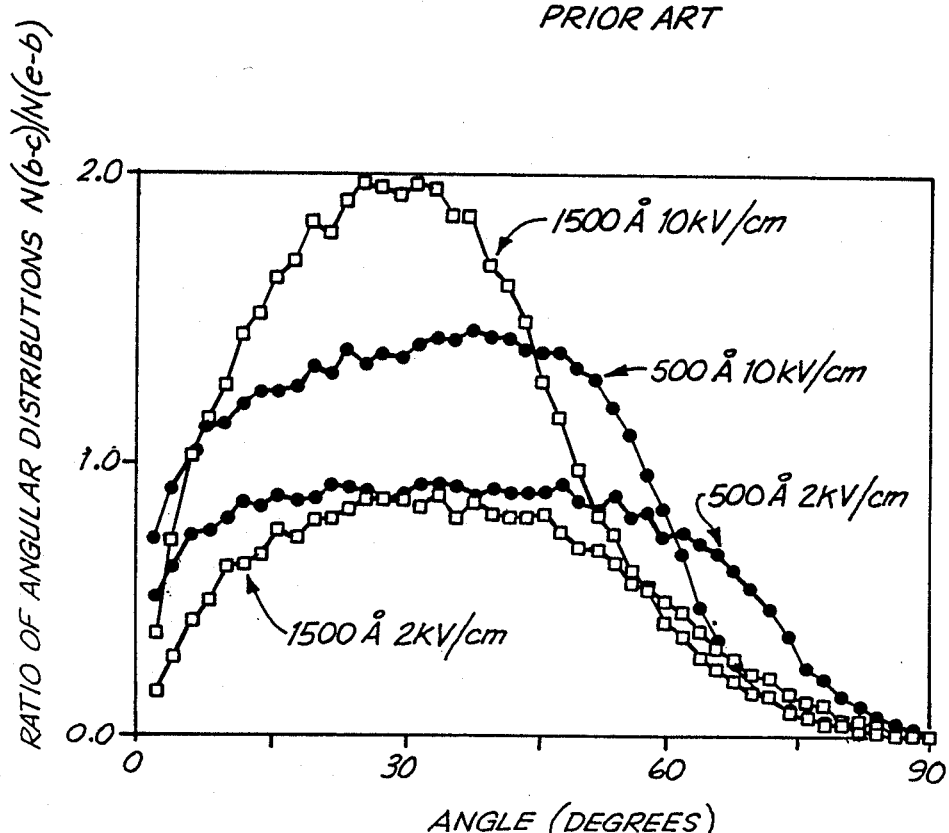
FIG. 4 shows the ratio of angular distribution of electrons arriving at the collector of the hot electron transistor with energies higher than the emitter barrier height to the angular distribution of electrons ejected from the emitter for two different base thicknesses and two electric fields.

In FIG. 3 we compare the distributions calculated for doping levels in the base, $N_d$, equal to $10^{15}$ and $10^{18}$ cm$^{-3}$. As can be seen from FIG. 3 the impurity scattering did not affect the energy distribution of hot, fast-moving electrons as one may expect. However, we should point out that we do not take into account the plasmon scattering which may be important at doping densities higher than $10^{18}$ cm$^{-3}$. As can be seen from FIG. 2, at 300K, a large fraction of the electrons reached the collector region with some loss of energy (~58% for W=3000 Angstroms, ~65% for W=500 Angstroms, and ~75% for W=1000 Angstroms).

One reason for a short characteristic ballistic length is related to the angular distribution of the electrons injected into the base. Indeed, electrons injected at large angles to the direction perpendicular to the emitter-base interface had to travel considerably larger distances than the base thickness W and they were more likely to experience scattering and energy loss. As a consequence the electrons reaching the collector without a loss of energy were primarily those injected at small angles and their angular distribution at the collector barrier was sharper. Hence, the electrons coming into the collector region were more suitable for a subsequent ballistic injection (as we propose below). This was verified by the calculation of the ratio of the angular distribution of electrons arriving at the collector with energies higher than the emitter barrier height to the uniform angular distribution of electrons injected from the emitter (see FIG. 4). Our results demonstrate that this effect was especially pronounced for relatively long bases and fairly high electric fields. It can be seen from FIG. 4 that under such conditions the number of electrons coming into the collector region under small angles increased dramatically compared to the initial distribution. In addition, we found that electrons injected into the base under small angles have a smaller mean transit time across the base as shown below.

Figure 5:
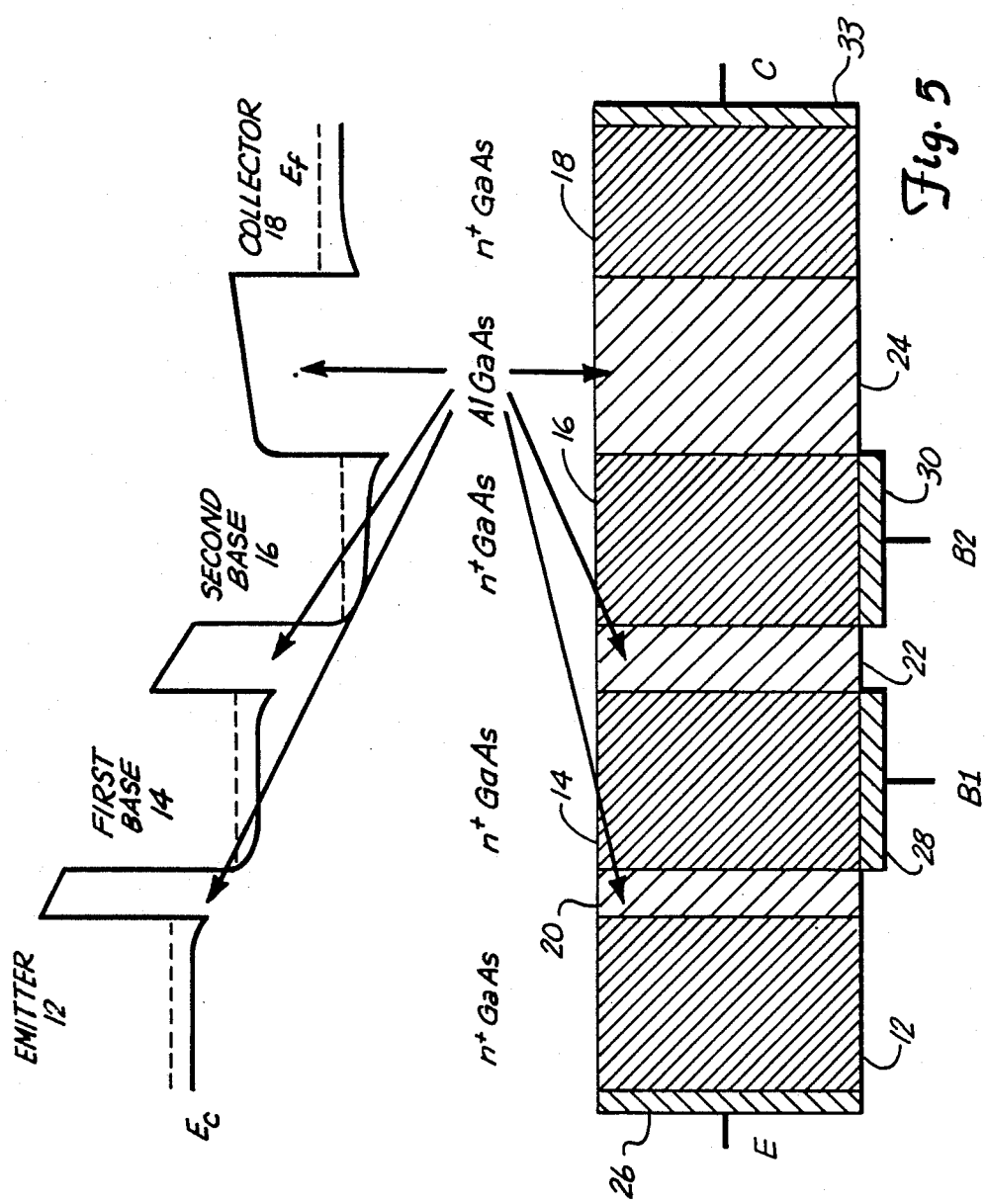
FIG. 5 is a schematic band structure of one preferred embodiment of the double-base hot electron transistor (DBHET) of the present invention.

The results of this analysis led us to the discovery that the performance of HETs and other high speed devices could be improved greatly by providing a more focused energetic carrier beam through the active region of the device. FIG. 5 shows schematically and by band diagram a double-base hot electron transistor (DBHET) 10 of the present invention. As illustrated in FIG. 5, DBHET 10 includes emitter 12, first base 14, second base 16, and collector 18. Emitter barrier 20 is positioned between emitter 12 and first base 14. Base-base barrier 22 is located between first and second bases 14 and 16. Collector barrier 24 is positioned between second base 16 and collector 18. Emitter contact 26 contacts emitter 12. First base contact 28 makes electrical contact to first base 14. Second base contact 30 makes contact to second base 16. Collector contact 32 makes electrical contact to collector 18.

Figure 6B:
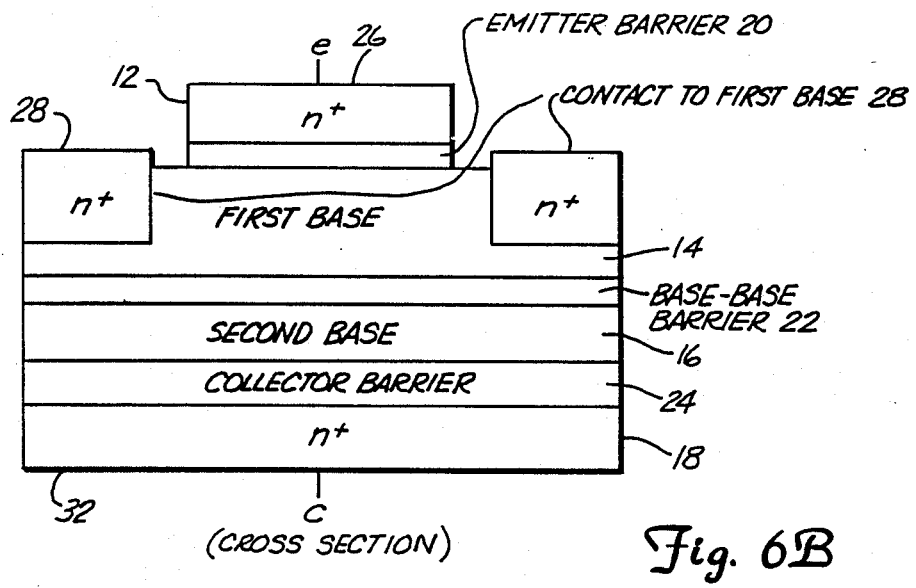
FIGS. 6A and 6B are top and cross-sectional views of one embodiment of the DBHETs of the present invention.
Figure 6A:
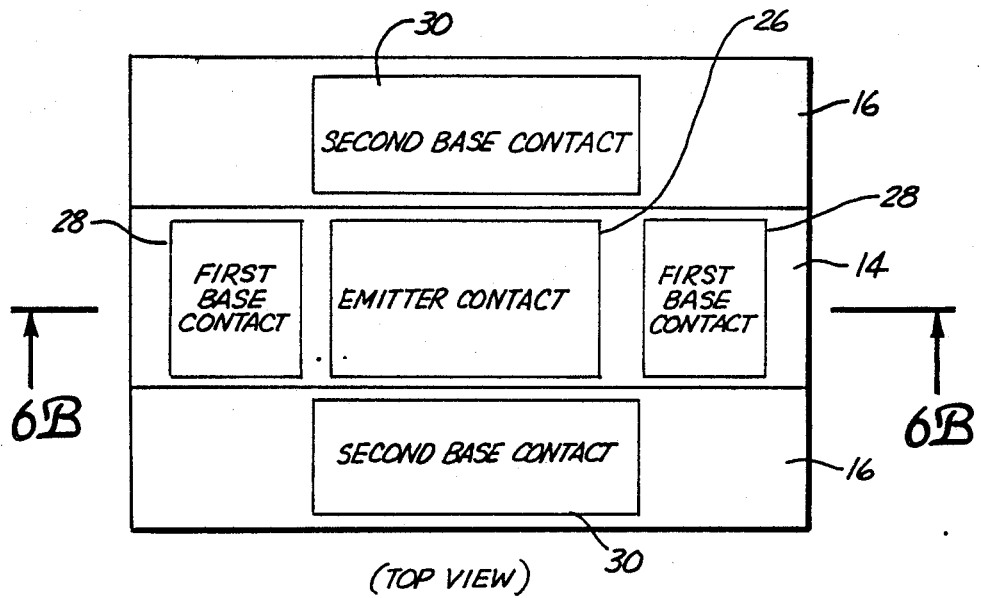

In the embodiment shown in FIG. 5, emitter 12, first base 14, second base 16 and collector 18 are formed by heavily doped N type (N+) gallium arsenide. Barriers 20, 22 and 24 are formed by aluminum gallium arsenide. FIGS. 6A and 6B show one preferred implementation of the generalized structure shown in FIG. 5 for DBHET 10.

In DBHET 10, first base 14 (accompanied by emitter barrier 20 and base-base barrier 22) acts as a solid state electron gun to focus and accelerate the electrons which are launched by emitter 12 and emitter barrier 20. Those fast and focused electrons are then injected from first base 14 (and/or through) over base-base barrier 22 into second base 16, which is the active region of DBHET 10. The input is applied through base contact 30 to second base 16 to modulate the flow of electrons from emitter 12 to collector 18.

With DBHET 10 of the present invention, the efficiency of launching and collecting ballistic electrons is substantially increased. The mean transit time for high energy electrons to traverse the active region (i.e. second base 16) can be reduced and the density of high energy electrons increased compared to a conventional HET. As a result, the DBHET of the present invention offers higher speed and higher power than conventional HETs.

In FIGS. 7A and 7B and 8A and 8B numerically calculated band structures of two different DBHETs at equilibrium (FIGS. 7A, 8A) and at an emitter-collector bias of 0.3 V (FIGS. 7B, 8B) are shown. FIG. 7 shows band structures for a DBHET with a GaAs first base. FIG. 8 shows and structures for a DBHET with an $Al_xGa_{1-x}As/GaAs$ first base with graded composition x. In these numerical calculations the contacts to the first and second bases are not taken into account. The calculations were done using the SEDAN-3 program. The structure parameters including the doping and composition profiles are explained in FIGS. 7A, 7B, 8A and 8B. An optional graded region at the second base side of the collector barrier is included to reduce the quantum reflection. In the DBHET, accelerated electrons coming into second base 16 with a sharper angular distribution are injected from first base 14 over the barrier sandwiched between the two bases (the base-to-base barrier 22). An input signal is applied to second base 16. As shown in FIG. 8B, a large electric field can be created in first base 14 by the composition and/or doping grading and by the voltage drop caused by the emitter-collector bias. Therefore, electrons in first base 14 can still be accelerated by this field even without a contact to first base 14. It is also clear from the band diagram of FIG. 8B that when the electrons can easily tunnel through a thin emitter barrier 20, many of these electrons can still have enough energy to pass over base-to-base barrier 22 and reach collector 18. This feature is potentially important for devices where tunneling through emitter barrier 20 may be quite significant.

In order to compare performance of the DBHET of the present invention with conventional HETs, a simulation similar to that discussed above was performed.

In the DBHET simulation, we assumed that base-to-base barrier 22 is not transparent (just as the emitter barrier in the simulation of the single base HET described above) and that other quantum effects are not important because bases 14 and 16 are relatively thick. We simulated the motion of 72,000 electrons injected over the emitter barrier 20 for various electric fields in the two bases 14 and 16 of DBHET 10. During their passage through second base 16, some of the electrons, injected from first base 14 over base-to-base barrier 22, may be scattered back to base-to-base barrier 22. Such electrons are assumed to contribute to the first base current if their energies are larger than barrier 22 or to the second base current otherwise.

FIG. 9 compares the mean transit time across a 500 Angstrom base of HET and of a DBHET with first base 14 of 1500 Angstroms thick. The field in second base 16 is fixed at 3 kV/cm while the field in first base 16 is varied in the same way as it is varied in the base of the HET under comparision, i.e. F=2, 6, and 10 kV/cm. Both the emitter barrier height and the base-to-base barrier height are 0.15 eV in this calculation. As can be seen from FIG. 9, the mean transit time of the high energy electrons across second base 16 is considerably reduced in DBHET 10 compared to a HET (by a factor of 2 to 3 in our case) and is nearly independent of energy over a 300 meV interval. In the low energy regime (0.2 eV), the mean transit time follows the same decreasing trend in both HET and DBHET. However, the low energy (cold) electrons can be elminated from the collector current by collector barrier 24. Hence, the overall response and speed of DBHET 10 should be primarily determined by the high energy (hot) electrons arriving at collector 18. Considerably more such high energy electrons are found in DBHET 10.

FIG. 9 and FIG. 10 also show that the ballistic motion can be considerably enhanced by the electric field in first base 14 created by either composition and doping grading 14 and/or by an external bias.

The fluctuations in the high energy tails of the transit time curves seen in FIG. 9 are caused by the finite number of the simulated electrons. In order to check convergence we simulated three groups of 72,000 electrons in a 500 Angstrom base of a HET with an electric field F=3 kV/cm and found out that for energies below 0.4 eV the fluctuations are less than five percent. For energy close to 0.44 eV the fluctuations increase to twenty-five percent because of a rapid decrease of the number of electrons in this energy range.

As can be seen from FIG. 10, the number of energetic (hot) electrons arriving at the collector region in DBHET 10 is much larger than that in a HET. Therefore, the fluctuations of calculated transmit time of high energy electrons are significantly less for the DBHET simulation than for the HET simulation.

As mentioned above, first base 14 focuses the electron beam. This focusing effect is caused by two different mechanisms: first, by the acceleration of electrons in the electric field, i.e. by the increasing the longitudinal component of the drift velocity in the electric field; and second by the loss of electrons injected at large angles during their passage through first base 14. The focusing effect is more pronounced for a relatively long first base 14 of DBHET 10 with a large built-in electric field in agreement with the curves shown in FIG. 4. It is also worthwhile to mention that tunneling through thin barriers 20 and 22 may also help to focus the electron beam since electrons with large longitudinal energies have large probabilities to tunnel through. We may thus expect that the focusing effect in the DBHET could be even stronger than that shown.

In addition to providing a focused electron beam for second base 16, first base 14 also acts as a controlled "electron gun" accelerating the electrons injected from the emitter 12 in the electric field. As the electric field in first base 14 is increased, the number of electrons injected into second base 16 and the peak energy of the distribution are also increased while the ratio of electrons scattered back to base-to-base barrier 22 over electrons arriving at collector 18 is decreased. This is illustrated by the solid curves in FIG. 10 representing the energy distributions of electrons at collector 18 under the same conditions as in FIG. 9. For comparison, the corresponding energy distributions at the collector for the HET are also shown in FIG. 10 by the dashed curves. Clearly, the fraction of high energy electrons arriving at collector 18 is much larger in DBHET 10 than at the collector of a HET as mentioned above. Combining this important feature with the reduction of mean transit time of the high energy electrons demonstrates the advantage of the DBHET compared to a conventional HET.

In conclusion, our studies show that the electrons injected from the emitter at large angles may be subjected to many scattering events and, hence, lose energy before reaching the collector. The angular distribution of electrons is found to be sharper after the hot electrons travel through a doped layer with an electric field. In order to utilize this effect we have invented a double-base hot electron transistor where first base 14 acts as an "electron gun" accelerating electrons and as a "lens" providing better focused ballistic electrons injected into second base 16 where an input signal is applied. First base 14 can be controlled by providing contact 28 to it, which allows us to monitor the ballistic injection. The overall transit time of the high energy electrons across second base 16 of DBHET 10 can be considerably reduced and the number of such electrons can be significantly increased even for a moderate DC bias in first base 14. Moreover, the injection of electrons is mainly controlled by first base 14 which preferably is buried under emitter barrier layer 20. Consequently, the DBHET is less sensitive to temperature and light than a HET. Bearing in mind the fact that to date HETs are virtually not working at room temperature, such temperature and light stability of the DBHET are particularly important. Further, since the electrons in the active region have much less diverse paths the DBHET offers superiority in noise figures as well.

The transit time in the DBHET reaches below 0.2 ps which is compatible to the transit time in a typical quantum-well tunneling device. However, such quantum-well devices are known to be intrinsically low power due to low DC bias voltages and area and impedance limitations associated with the capacitance of very narrow junctions. B. Jogai, K. L. Wang, and K. W. Brown, Appl. Phys. Lett., vol 48, no. 15, 1003 (1986). The DBHET has a much larger separation between the emitter and the collector (typically 3000 Angstroms compared to 100 Angstroms in a pure quantum-well oscillator), and therefore can operate at much higher power than a typical quantum-well tunneling device.

In addition to DBHETs being of high-performance electronic devices, they can also be used for high resolution hot electron spectroscopy owing to the extra freedom of control provided by contact 28 to first base 14. This can enhance the study of the physics of hot electron transport in semiconductors.

In the foregoing description of the DBHET of the present invention, an AlGaAs/GaAs material system has been specifically described. Other material systems, such as InAlAs/InP or InGaAs/AlGaAs can also be used to provide a controlled ballistic injection in DBHET structures.

In addition, the forming and injecting of a focused beam of energetic electrons by the use of a first base and a base-base barrier can be used to advantage in a wide variety of high speed devices. For example, there are a variety of known structures for providing ballistic electron injection, including heterojunctions, planar doped barriers and tunnel barriers. Each of these types of ballistic electron ejectors can be used in conjunction with the double-base structure of the present invention.

Although the present invention has been described with reference to preferred embodiments, workers skilled in the art will recognize that changes may be made in form and detail without departing from the spirit and scope of the invention. For example, the present invention is also applicable to structures in which high energy holes are injected and transported ballistically. Such hot hole transistors will hence have p+ emitter contact, p+ collector contact and p+ bases.

What is claimed is:

1. A transistor comprising:
   an emitter for launching electrons;
   a collector for receiving electrons;
   a first base between the emitter and the collector;
   means for applying an electric field in the first base whereby electrons launched from the emitter and received by the first base are accelerated in a direction generally parallel to the electric field;
   a second base between the first base and the collector having a second base electrical contact for applying an input signal;
   a collector barrier between the second base and the collector; and
   a base-base barrier between the first and second bases.

2. The transistor of claim 1 wherein the emitter barrier includes a region of semiconductor material having a band gap which is greater than band gaps of the emitter and the first base.

3. The transistor of claim 1 wherein the collector barrier includes a region of semiconductor material having a band gap which is greater than band gaps of the second base and the collector.

4. The transistor of claim 1 wherein the base-base barrier includes a region of semiconductor material having a band gap greater than band gaps of the first and second bases.

5. The transistor of claim 2 wherein the emitter and collector are n conductivity type.

6. The transistor of claim 5 wherein the first and second bases are n conductivity type.

7. The transistor of claim 1 and further including:
   means for applying an input signal to the second base whereby the input signal modulates the flow of electrons from the first base to the collector.

8. The transistor of claim 1 wherein the second base has a thickness which is approximately equal to or less than a mean free path of majority carriers in the second base.

9. A ballistic transport semiconductor device comprising;
   injector means for producing a beam of high energy carriers;

collector means for collecting the beam of high energy carriers;

an active semiconductor region through which the beam passes;

means for applying an input signal to the active semiconductor region for controlling flow of the beam from the injector means to the collector means; and means positioned between the injector means and the active semiconductor region for accelerating the beam in an electric field due to an applied voltage potential and for focusing the beam.

10. The transistor of claim 2 wherein the emitter and collector are p conductivity type.

11. The transistor of claim 10 wherein the first base and second base are p conductivity type.

12. A semiconductor device comprising:

an active region having an active region electrical contact for applying an input signal;

a ballistic launcher for providing a focused beam of high energy carriers to the active region, the ballistic launcher comprising:

an emitter for providing carriers;

a base for providing an accelerating electric field to accelerate carriers received from the emitter in a direction away from the emitter;

a base contact electrically connected to the base;

a first barrier between the emitter and the base; and a second barrier between the base and the active region.

13. A transistor comprising:

an emitter;

a collector;

an active region where an input signal is applied;

a first base between the emitter and the active region and having a thickness sufficient to focus and accelerate carriers from the emitter toward the collector with an electric field; and a barrier layer between the first base and the active region to separate the active region from the first base and to select electrons with energy above a selected level.

* * * * *